US009399234B2

(12) United States Patent
Maric et al.

(10) Patent No.: US 9,399,234 B2
(45) Date of Patent: Jul. 26, 2016

(54) REACTIVE SPRAY FORMATION OF COATINGS AND POWDERS

(75) Inventors: Radenka Maric, Richmond (CA); Thomas P. K. Vanderhoek, Vancouver (CA); Justin Michael Roller, Vancouver (CA)

(73) Assignee: National Research Council of Canada, Winnipeg Manitoba (CA)

(*) Notice: Subject to any disclaimer, the term of this patent is extended or adjusted under 35 U.S.C. 154(b) by 1914 days.

(21) Appl. No.: 12/090,370

(22) PCT Filed: Oct. 17, 2006

(86) PCT No.: PCT/CA2006/001713
§ 371 (c)(1),
(2), (4) Date: Jun. 24, 2008

(87) PCT Pub. No.: WO2007/045089
PCT Pub. Date: Apr. 26, 2007

(65) Prior Publication Data

US 2008/0280056 A1 Nov. 13, 2008

Related U.S. Application Data

(60) Provisional application No. 60/726,614, filed on Oct. 17, 2005.

(51) Int. Cl.
*C23C 16/00* (2006.01)
*B05B 7/20* (2006.01)
*B05B 7/16* (2006.01)

(52) U.S. Cl.
CPC ................ *B05B 7/208* (2013.01); *B05B 7/166* (2013.01); *B05B 7/1646* (2013.01); *C23C 4/123* (2016.01)

(58) Field of Classification Search
CPC ...... C23C 4/121; B05B 7/1646; B05B 7/166; B05B 7/208
USPC .......................................... 427/248.1–255.27
See application file for complete search history.

(56) References Cited

U.S. PATENT DOCUMENTS 5,027,742 A * 7/1991 Lee et al. ...................... 118/300
5,445,325 A 8/1995 White et al.

(Continued)

OTHER PUBLICATIONS http://www.engineeringtoolbox.com/flow-meters-d_493.html, accessed Mar. 22, 2012.*

(Continued)

*Primary Examiner* — Michael Wieczorek
*Assistant Examiner* — Michael G Miller
(74) *Attorney, Agent, or Firm* — Michael R. Williams; Ade & Company Inc.

(57) ABSTRACT

An apparatus and method for open-atmosphere flame based spraying employs a nozzle to preheat, pressurize and atomize a mechanically pumped reactive and flammable liquid solution through a small orifice or a nozzle and then a set of pilot flames to combust the spray. The liquid feedstock is preheated to a supercritical temperature before reaching the nozzle and is pressurized before spraying due to a reduced size of the outlet port of the feedstock flow channel relative to the inlet. A supplementary collimating, or sheathing, gas is supplied to the flow channel of the feedstock and both the feedstock and the supplementary gas are uniformly heated before spraying. This arrangement helps to avoid clogging of the nozzle and results in satisfactory control of the properties of the particulate products of the spraying procedure.

5 Claims, 7 Drawing Sheets

(56) References Cited

U.S. PATENT DOCUMENTS

| | | | | |
|---|---|---|---|---|
| 5,863,604 | A | 1/1999 | Hunt et al. | |
| 5,932,293 | A | 8/1999 | Belashchenko et al. | |
| 5,997,956 | A * | 12/1999 | Hunt et al. | 427/446 |
| 6,132,653 | A | 10/2000 | Hunt et al. | |
| 6,277,448 | B2 | 8/2001 | Strutt et al. | |
| 6,491,967 | B1 | 12/2002 | Corderman et al. | |
| 6,601,776 | B1 | 8/2003 | Oljaca et al. | |
| 6,728,092 | B2 * | 4/2004 | Hunt | H01G 4/085 361/301.4 |
| 6,793,975 | B2 | 9/2004 | Hunt et al. | |
| 6,808,755 | B2 | 10/2004 | Miyamoto et al. | |
| 6,861,101 | B1 | 3/2005 | Kowalsky et al. | |
| 2004/0234687 | A1 | 11/2004 | Schmid et al. | |
| 2005/0019551 | A1 | 1/2005 | Hunt et al. | |

OTHER PUBLICATIONS

Graco pump specs, http://www.graco.com/content/dam/graco/tech_documents/manuals/307/307363/historic/307363EN-J.pdf, accessed online Jan. 8, 2015.*

Nordson gun specs, http://emanuals.nordson.com/finishing/files/cont-liq/107973j02.pdf, accessed online Jan. 8, 2015.*

* cited by examiner

REACTIVE SPRAY FORMATION OF COATINGS AND POWDERS

PRIOR APPLICATION INFORMATION

This application is the National Stage of International Application No. PCT/CA06/01713, filed Oct. 17, 2006 which claims the benefit under 35 U.S.C.119(e) of U.S. provisional application Ser. No. 60/726,614, filed Oct. 17, 2005.

FIELD OF THE INVENTION

This invention, termed for identification purposes Reactive Spray Deposition Technology (RSDT), relates to the deposition of coatings and to the formation of powders, usually of particle size in the nanometer range, by atomizing a reactive liquid feedstock comprising flammable components. In particular, RSDT is an open atmosphere flame based spray technique that uses a nozzle to atomize a mechanically pumped liquid solution through a small orifice and then a set of pilot flames to combust the spray.

BACKGROUND ART

Reactive Spray Deposition Technology falls into a subset of deposition processes known collectively as thermal spraying. Thermal spraying and plasma spraying are both common deposition techniques used in the production of materials with controlled microstructure. Plasma spraying traditionally involves passage of a solid powder through or into a DC or AC plasma, subsequent melting of the solid particles and splats of material deposited on the substrate. The length of time the material spends in the plasma depends on the type of torch, gas flows and plasma shaping devices (i.e. cooling shrouds). Microstructure and spray efficiency are partially determined by torch design. Plasma processing is considered a high-energy technique. Alternatively, lower energy technologies have been explored as possible alternate deposition techniques to plasma spraying.

Several similar techniques for open atmosphere lower energy flame depositions have been developed to date. Listed below are some developments in thermal spray technology related to fuel cells:

1) Flame assisted vapour deposition (FAVD), in London at the Imperial College of London (UK-1995),
2) Oxy-acetylene combustion assisted aerosol-chemical vapour deposition (OACAACD), in China at the University of Science and Technology of China (China-2004),
3) Combustion chemical vapour deposition (CCVD) at MicroCoating Technologies, Georgia Tech, and North Carolina State University, (USA-1993),
4) Flame spray Pyrolysis in Zurich at ETH-Particle Technology Laboratory, (Switzerland-1998), and
5) Liquid Feed Flame Spray Pyrolysis at University of Michigan (USA-2004)

The techniques listed above all relate to a generalized process involving pumping a dissolved metal-organic or metal-inorganic precursor through an atomizing nozzle and combusting the atomized spray. The atomization of the liquid can be accomplished by ultrasonics, air shear, liquid pressure, dissolved gases, heat or a combination of energy inputs. Precursor solutions containing the metal reactants required in the deposited film are pumped under pressure to the nozzle by use of a syringe or HPLC pump. In addition, some techniques feed the precursors to the combustion nozzle as an aerosol and the combustion nozzle is not used in the atomization process.

In some of the techniques, a dissolved gas is added to the precursor solution to aid in atomization. The droplet size and distribution has an impact on the final coating and is therefore important in the design/arrangement of the technique or type of atomizer. Regardless of the nozzle type, the atomized spray is then combusted by an ignition source such as a single pilot flame from a point source or a ring of pilots surrounding the exit of the nozzle. An optimal ignition point must be chosen since igniting too close to the exit of the nozzle results in a fuel rich mixture that does not burn easily while igniting too far away results in an oxidant rich mixture. Pilot gases consist of methane and oxygen, hydrogen or an oxy-acetylene type gas. Pilot gases are supplied to the system by mass flow controllers or by passive rotameters.

Depositions onto substrates usually occur by positioning the flame in front of or near the desired substrate and allowing the reaction to occur long enough for the desired thickness of film. The distance from the flame tip to the substrate influences the coating morphology, efficiency, boundary layer and the substrate temperature. If a nano-structured or dense film is desired then the flame should penetrate the boundary layer of the substrate. Longer flames (i.e. distance from nozzle to substrate) and higher concentrations of precursor material favour nucleation of particles and agglomeration instead of growth from the vapour phase (of a film) directly on the substrate. In other words, the droplets vaporize leaving the precursor material as a small gas vapour that then nucleates into a solid and then the solids agglomerate into larger particles. This process occurs from spray to flame tip and beyond. A powdery agglomeration of particles with poor adhesion occurs if the gap between the nozzle and the substrate is too large.

Care must be taken to prevent thermal shock to certain substrates by controlling the heat up and cool down to deposition temperatures when the flame is brought very close to the substrate. This is generally done by heating the substrate from the back by resistive heaters or by another flame.

Additionally, the heat-up and cool-down must be performed without the reactive precursors present so that a constant deposition temperature is maintained during film growth.

The above-listed techniques differ in some respects such as the method of atomization, type of atomizer, solution injection geometry and the fuel used in the flame. Summaries of the techniques are listed below.

Xu and colleagues (3) at NC State used a TQ-20-A2 Meinhard nebulizer for atomizing and a single point pilot flame for ignition of the atomized spray. In addition, a heating torch was applied to the back of the substrate holder to minimize the thermal gradient between the front and back of the substrate.

Meng et al (2) at the University of Science and Technology in China used a modified oxy-acetylene torch with a 2 mm diameter and fitted at an angle of 45° angle to the substrate. Precursors were supplied to the torch by means of an ultrasonic nebulizer injected directly into the torch. The oxy-acetylene flame core reaches temperatures as high as 3000 C. Unlike other versions of this technology, the flame is not produced by the precursor solvent but by an oxy-acetylene gas mixture. This process has been named oxy-acetylene combustion assisted aerosol-chemical vapor deposition (OA-CAACVD).

The system at nGimat (formerly MicroCoating Technologies) consists of a proprietary spray/combustion nozzle, the Nanomiser®, that functions on pressure and heat input for formation of very small droplets that are then combusted by a ring of methane/oxygen pilot lights. It is claimed that the specific geometry of the Nanomiser® allows for the formation of these small droplets which has not been attainable by other technologies. A precursor solution is delivered under pressure to the nozzle and heated prior to exit where a shear force is created by an unheated collimating gas.

Dr. Xu at NC State uses a system similar to nGimat, however the Nanomiser® nozzle has been replaced by a different off-the-shelf nebulizer.

Steele and Choy (1) at the Imperial College of London have been using a system of deposition named flame assisted vapor deposition (FAVD). The system was first reported in 1995 and work on SOFC cathode materials was published in 1997. The process consists of an air atomizing nozzle and a separate flame. The air atomizer is directed at a substrate on a hotplate and a separate flame is arranged perpendicular between the substrate and atomizer. The atomized spray passes through the flame and onto the substrate.

Flame Spray Pyrolysis (FSP) was developed at ETH in Switzerland by Dr. Pratsinis. A variety of products have been synthesized by FSP as for example silica, bismuth oxide, ceria, zinc oxide, zinc oxide/silica composites, platinum/alumina. Using this technique, a 35 cm spray flame produces 300 g/h of fumed silica using oxygen as dispersion gas. The particles are colleted in a baghouse filter unit.

SOFC/PEM (solid oxide fuel cell/proton exchange membrane) components can be fabricated via routes such as electrochemical vapour deposition (EVD), chemical vapour deposition (CVD), physical vapour deposition (PVD), sol-gel, RF-sputtering, spin coating, slurry spraying, plasma spray and screen-printing.

Various developments in the field of thermal spraying have also been presented in patent literature, e.g. U.S. Pat. No. 6,601,776 to Oljaca et al, U.S. Pat. No. 6,808,755 to Miyamoto et al., and US Patent Application 2005/0019551 to Hunt et al.

While all the above developments have some advantages, there is still a need for a low cost, rapid processing method that can be performed continuously, preferably without the need for long sintering times at elevated temperatures.

SUMMARY OF THE INVENTION

In the following specification and claims, unless expressly stated otherwise or unless the context clearly indicates otherwise, the use of singular mode denotes also plural mode.

In accordance with one aspect of the invention, there is provided an apparatus for thermal spraying of a reactive liquid feedstock, the apparatus comprising:

a feedstock container, first heating means for heating contents of the feedstock container to a supercritical temperature, an elongated tubular conduit for passing the feedstock therethrough, having a first port connected to the feedstock container and a second port for discharging feedstock, the second port having a substantially smaller size than the first port to create a flow restriction for the feedstock to be discharged, the second end forming or associated with a nozzle for collimating flow of the discharged feedstock, pump means for delivering superheated feedstock to the conduit, a tubing connected to a source of an auxiliary gas and to the second port for delivering auxiliary gas to the second port, second heating means disposed around the conduit and the sleeve for simultaneous heating of the feedstock flowing through the conduit and of the auxiliary gas, and burner means disposed at the second port for igniting said feedstock when it leaves the second port along with the auxiliary gas.

In an embodiment of the invention, the tubing forms a chamber sleeve surrounding the conduit.

In an embodiment of the invention, the sleeve for the auxiliary gas is arranged coaxially and concentrically around the conduit.

In one embodiment, the conduit is formed of a tube of decreasing inner diameter from the first port to the second port.

In another embodiment, the conduit is formed of a number of interconnected tubes of decreasing inner diameter from the first port to the second port.

In one embodiment, the second heating means is arranged for uniform heating of essentially the entire length of the feedstock conduit.

The apparatus may also comprise gas curtain means disposed for distributing a curtain of a non-flammable gas, typically air, transversely into a path of burning feedstock discharged from the exit port and the nozzle.

Further, the apparatus may comprise supplementary material reactant supply means disposed to deliver a stream of a reactant or reactants into the stream of the feedstock after it has been discharged from the nozzle and ignited. The delivery may take place with the air curtain in operation, the point of reactant delivery being downstream of the air curtain.

In accordance with another aspect of the invention, there is provided a method for spraying a reactive fluid feedstock, the method comprising providing a conduit having an inlet port and an outlet port, the size of the outlet port being significantly smaller than the size of the inlet port, heating a reactive feedstock to a supercritical temperature, passing the heated reactive feedstock under pressure through the conduit, providing a sleeve around the conduit, the sleeve being in communication with a source of an auxiliary gas and with the outlet port, passing an auxiliary gas through the sleeve, heating the sleeve and the conduit to maintain a supercritical temperature of the feedstock and the auxiliary gas, providing a flame at the outlet port of the feedstock and the auxiliary gas resulting in a reactive fluid flame spray at the exit port, and controllably reducing the temperature of the flame spray to produce a desired degree of reaction and to control the properties of particulate products of the reactive spray.

The method may further comprise the step of introducing a spray of a supplementary material into the path of the reactive spray in order to produce a combined coating resulting from the reactive feedstock and the supplementary material.

BRIEF DESCRIPTION OF THE DRAWINGS

The invention will be described in more detail by way of the following description in conjunction with the drawings in which.

DETAILED DESCRIPTION OF THE INVENTION

Figure 1:
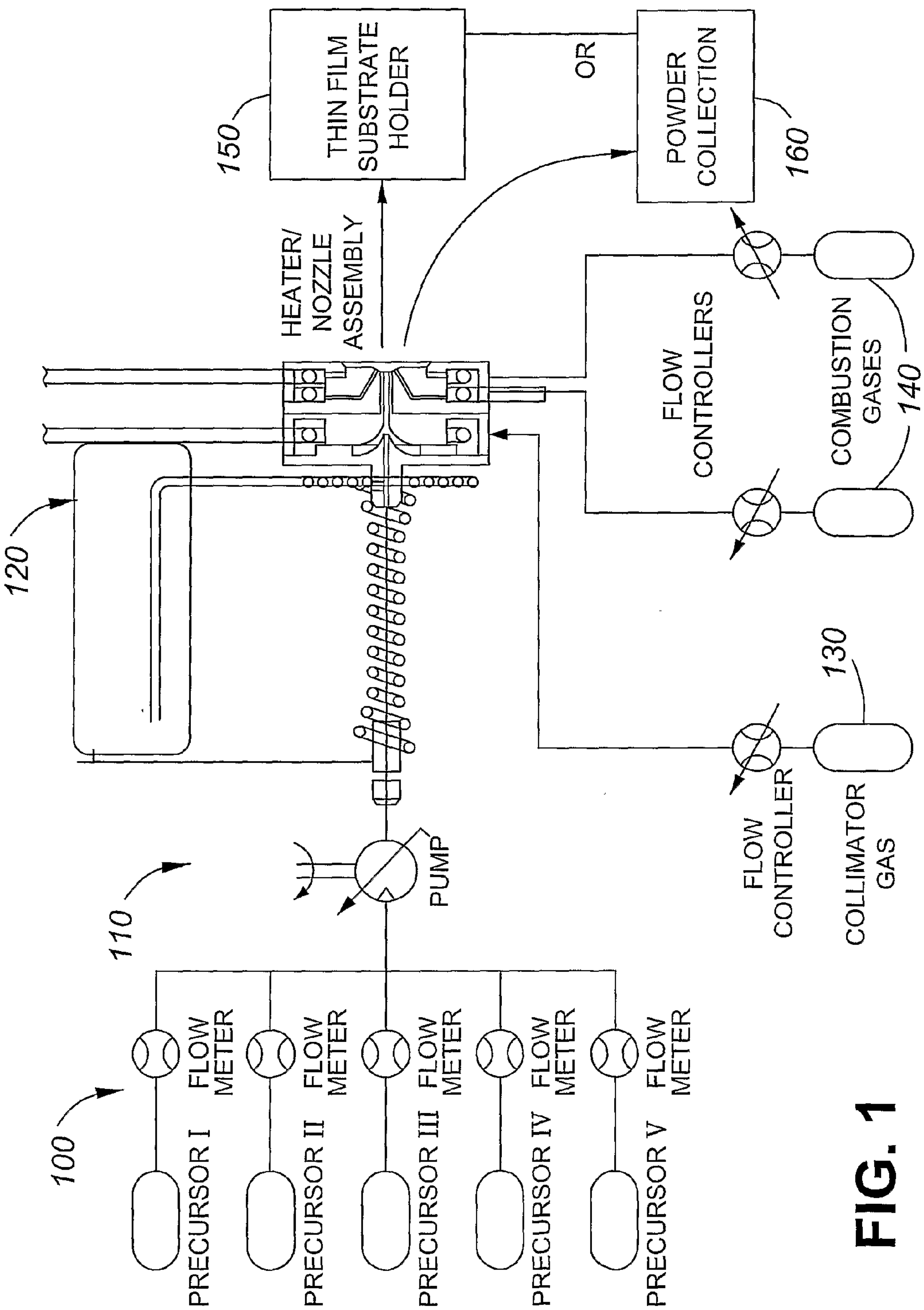
FIG. 1 is an overall representation of an embodiment of the RSDT apparatus of the invention.

As represented schematically in FIG. 1, an exemplary apparatus (system) of the invention includes a number of precursor containers 100 with flow meters, connected through a pump 110 to a spraying assembly (also termed "nozzle assembly") 120. The assembly 120 functions to atomize a liquid precursor or precursors 100 when mixed with combustion gas and a collimating (sheath) gas. A source of a collimating (sheath) gas 130 and a source of a combustion gas 140, each with flow controllers, are each connected to the spraying assembly 120. Depending on detailed structural arrangements shown in further figures, the product(s) of the associated spray method are either deposited on a substrate 150 or collected in a separate container 160.

Figure 2:
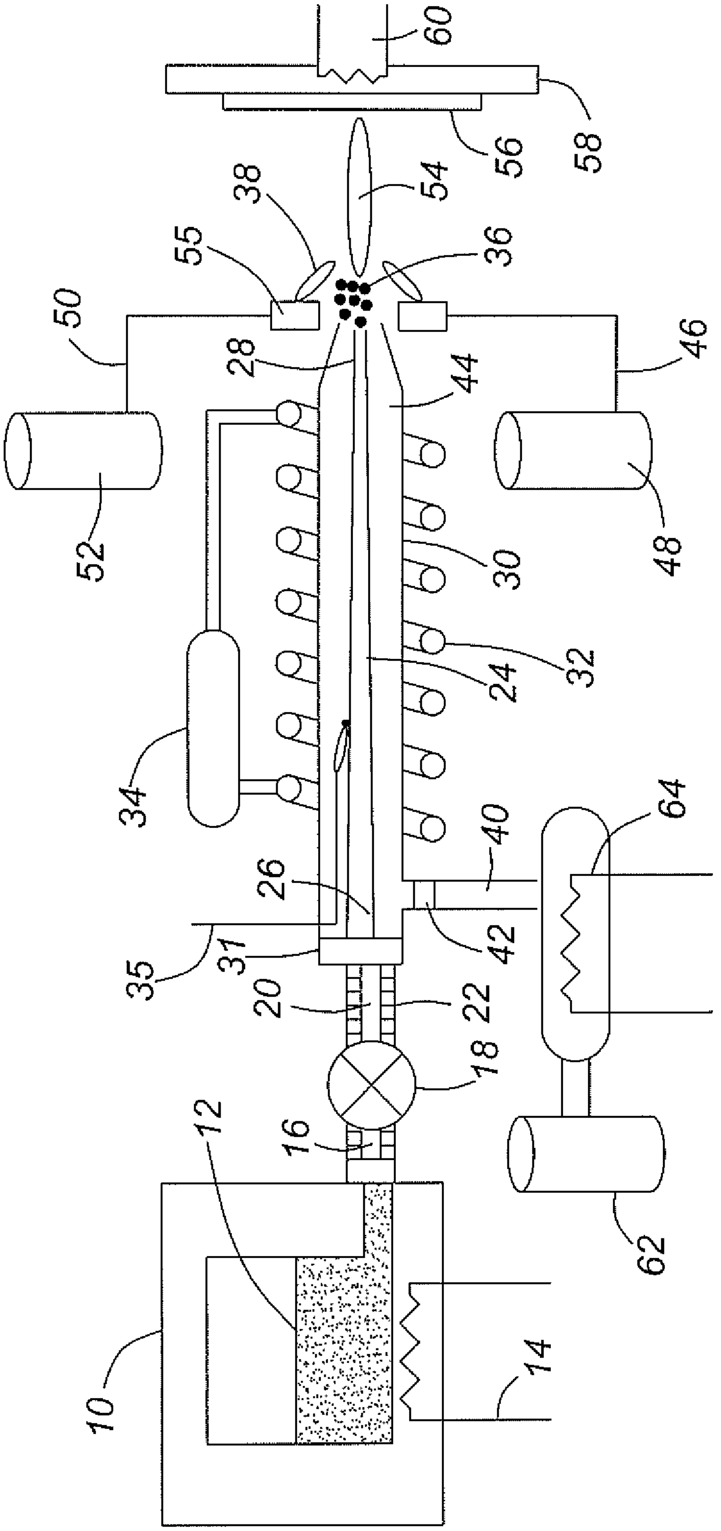
FIG. 2 is a schematic view of another embodiment of the apparatus.

Turning now to FIG. 2, the apparatus of FIG. 1 is shown in more detail. The precursor container 10 holds a quantity of a precursor (mixed with a solvent to provide a feedstock solution) 12. The precursor can be an organo-metallic, inorgano-metallic species, slurries or polymeric species. The solvent may be an aqueous or organic solvent and may contain an additional dissolved/liquefied gas such as propane, dimethyl ether or carbon dioxide.

A heater 14 is installed on the container 10, the heater being suitable to heat the precursor to a supercritical temperature.

The liquid precursor feedstock solution 12 is kept under pressure in the container 10 and pumped through line 16 by a pump 18. The superheated liquid (fluid) exits the pump 18 and enters the delivery line 20. Delivery lines 16 and 20 are insulated with an insulation layer 22. Then the supercritical fluid 12 enters the nozzle assembly 120. The fluid is passed through an open-ended tube 24 that has an opening port 26 and an exit port 28. The diameter (or size, in case of non-cylindrical tubes) of opening 26 is larger than that of the port 28. A chamber 30 encloses the tube 24. The tube 24 is sealed to the chamber 30 through a fitting 31.

The open-ended tube 24 can be manufactured out of a traditional metallic material, or for applications such as cermet depositions can be replaced with a suitable heat-resistant non-metallic material such as graphite to allow higher temperatures of the deposition medium. It is not necessary that the tube be of gradually decreasing diameter; instead, its inner size can change step-wise, e.g. by using interconnected telescoping tubes.

In the embodiment illustrated, the larger (inlet side) inner diameter of the tube 24 was about 0.006", or 0.15 mm. The smaller (outlet side) inner diameter was about 0.004" or 0.1 mm. The length of the tube from the inlet to the outlet was about 4" (10 cm).

An induction heater 32 surrounds the chamber 30 to maintain the temperature of the process streams via a feedback controller 34. The temperature of the tube 24 is controlled by a temperature controller 35. A combination of pressure (supplied by the pump 18), optional dissolved/liquefied gas (added into container 10) and heat input (via induction heating 32) aid in the formation of a uniform process stream 36 which can be either solid, liquid or gas or a mixture of these phases. This stream 36 can either be used directly for processing (i.e. spraying without combusting) or can be introduced through or near a pilot burner 38 installed at the periphery of the exit port 28.

The system may employ off-the-shelf components readily available in the HPLC (high performance liquid chromatography) and RESS (rapid expansion of supercritical spray) industries for storage and delivery of precursor solutions.

The chamber 30 functions to prevent shorting of the induction coil 32 and to channel a sheath gas 40 therethrough. The gas 40 enters the chamber 30 through an auxiliary connection 42, and exits the chamber at a tapered nozzle exit 44. The nozzle 44 acts to shape, accelerate and assist in atomization of the process stream. A shearing force is placed on the stream 36 exiting the tube 24 by the passing of gas 40 out the nozzle 44 of the chamber 30, the force helping to turbulently mix the deposition medium with the collimating (sheath) gas 40.

It is noted that the heater 32 is placed such that it maintains the desired temperature of both the fluid feedstock 12 flowing through the tube 24, but also the gas 40.

Although the formation of a supercritical fluid is not necessary for deposition with the equipment specified, in cases where a supercritical fluid is desired for a specific deposition, vessel 10 and tube 24 can be heated to generate supercritical fluid prior to entering the nozzle assembly. In such cases, the induction heater 14 is used to maintain the temperature of the feedstock 12.

The liquid droplets 36 are directed toward a pilot light 38 (fuel line 46, fuel container 48 and an oxidant line 50 and container 52) and are combusted into a flame 54. The fuel and oxidant are directed by tubing to a pilot burner assembly 55 where they are combusted.

The pilot burner assembly 55 consists of a block disposed concentrically around the exit port and having e.g. eight holes through which the fuel and oxidant are directed. The pilot burner assembly 55 can be integrated into the body of the nozzle 120 or consist of a separate body altogether. The flame 54 is directed at a substrate 56, which is mounted on a holder 58 that can optionally be heated by a heater 60.

The feedstock 12 for the system may consist of precursors that are dissolved in liquefied gas and/or an organic liquid mixture in the vessel 10. Liquefied gases that have been successfully sprayed include propane, carbon dioxide and di-methyl ether. Liquefied gases can be combined with organic solvents that are chosen based on their capacity to dissolve precursors and on their physical properties. The physical properties include but are not limited to those attributes that allow finer atomization (boiling point, viscosity, surface tension, etc.). Pumping 18 and storage components 10 are available off-the-shelf and are selected to allow extremely high pressures up to 680 bar and temperatures up to 150 C. prior to introduction into the nozzle and much higher inside the nozzle if utilized in conjunction with the second heat source 32. Primarily, the decomposition temperature of the dissolved precursors limits the solution temperature within the tube 24. Therefore, the number of solvents and specific precursors used for precursor preparation is increased due to elevated temperatures and the excellent solvation properties of supercritical fluids.

As mentioned above, the resulting spray 36 can then be combusted or used directly in a spray process. A combusted spray produces a flame 54 that can be shaped by the use of a nozzle 44 that acts as a collimator for the spray 36 and flame 54. The conically narrowing, collimating portion 44 of the chamber 30 is fed with a heated gas 40 that turns the laminar flame into a turbulent flow regime. The gas is supplied from a reservoir 62 and heated by means of a heater 64.

The flame 54 can either be directly positioned over a substrate 29 for thin film deposition as shown in FIG. 2 it or can be used in a particle collection system 160 for collection of nanoparticles.

Figure 3:
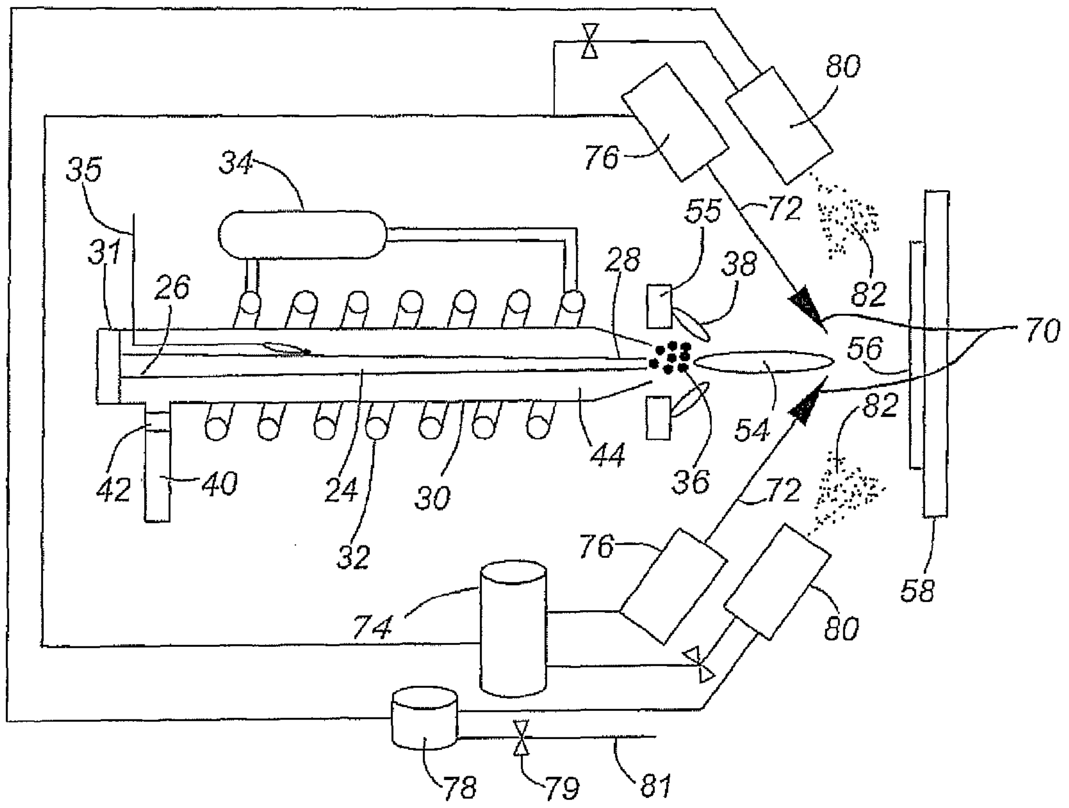
FIG. 3 is a schematic view of yet another embodiment of the apparatus.

In FIG. 3, showing another embodiment of the apparatus, same elements as in FIG. 2 are indicated with same reference numerals. Elements 10-22 are omitted for clarity.

As shown in FIG. 3, the flame can be quenched by a non-flammable gas or liquid medium 70 to freeze the reaction in the flame 54. Water, air or nitrogen can be used as the medium 70 to provide qas curtain means to stop the reaction at various points for control of particle properties such as morphology and size. In the embodiment illustrated in FIG. 3, a number of air streams arranged at an angle or perpendicularly to the spray direction, so-called air knives 72, is used to quench the flame in a short distance, while creating a turbulent mixing environment. This turbulent mixing zone is used to evenly cool the process stream and prevent the agglomeration of particles prior to deposition on the substrate. Alternatively, the air streams 72, supplied from a source of compressed air 74 through blowers 76 can be directed tangentially to the flame spray stream, creating a so-called air horn, not illustrated. In each case, the medium 70 should be directed transversely to the flame spray.

The positioning, flow rate, velocity and shape of the quench stream affect the adhesion and efficiency of the deposition. Error! Reference source not found.5 and Error! Reference source not found.6 show that the substrate temperature is dramatically reduced by the introduction of the quench system and dependent on both the quench position and flow rate. By cooling the process stream in a short distance, the nozzle assembly 120 can be located much closer to the substrate than in traditional methods, increasing the efficiency of deposition, while maintaining the desired deposition morphology.

For co-deposition applications, gas-blast atomisers are used to introduce supplementary materials into the process stream. The quench system 72, 74, 76 described above is intended to cool the process stream sufficiently and to create a turbulent mixing zone to allow the uniform addition of supplementary materials to the deposition steam. Due to the adjustable nature of the quench system, the supplementary materials can have a low melting point or be otherwise temperature sensitive such as the ionomers used in PEMFC electrodes. The co-deposition assembly is shown in FIG. 3 where 78 is a container of a slurry to be sprayed and 80 denotes nozzles for delivering streams 82 of the additional slurry spray.

As an example of this co-deposition variant, the addition of carbon into the deposition stream allows the formation of platinum coated carbon particles with high active surface area.

In operation, a warming program with small controlled incremental steps bringing the flame closer to the substrate allows repeatable and precise control over the temperature profile of the substrate. A solution minus the dissolved precursors (designated as a blank) is used for a pre-heating stage of the deposition. Upon attainment of proper substrate temperature, a valve is switched to change to the solution containing dissolved precursors. This allows the start of the deposition to be done at the optimized temperature for adhesion. Similarly, the reverse can be done at the end of a deposition.

Application of the Invention

Low Temperature SOFC

A metal supported SOFC is an architecture envisioned to enable SOFCs to have high power output, low cost, high reliability and high durability. However, this requires that SOFCs operate at lower temperatures to avoid oxidation.

Figure 7:
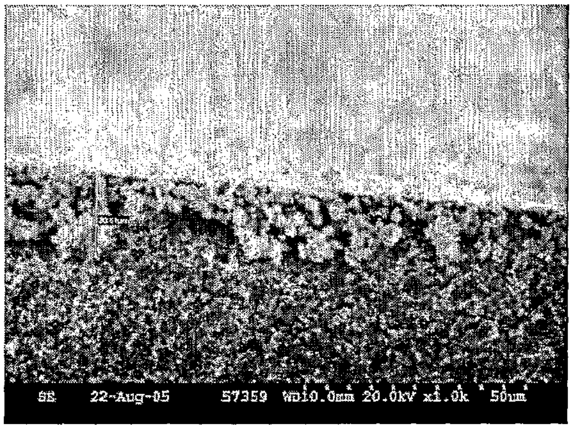
FIG. 7 illustrates SEM microstructure of a samarium doped ceria (SDC) electrolyte.

The first case study under investigation is the deposition of the solid oxide fuel cell electrolyte material samarium-doped ceria (SDC) onto a porous cermet substrate, the SEM being shown in FIG. 7. The apparatus and method of the invention is expected to facilitate the manufacture of both dense and porous structures to be deposited on this substrate. The fabrication of the necessary active layers can be completed in situ, without a lengthy high temperature post-processing step. The removal of this step should eliminate unfavourable reactions between consecutive layers of the final fuel cell and material shrinkage and cracking that can be common in conventional processing techniques. Initial depositions were performed on a 17 mm diameter button cell composed of 8% doped yttrium-stabilized zirconia. The solution formulated consists of two concentrations of SDC, 10 mM and 1 mM. The solvents used were toluene, acetone and di-methyl ether and were chosen based on their solvation characteristics for the chosen precursor metals. The precursor materials consisted of cerium-2 ethylhexanoate (Ce-2eh) and samarium acetylacetonate (Sm-acac) mixed in molar ratios of 10% samarium and 90% cerium. Precursors and liquid organic solvents were added to an appropriate vessel and then sealed. Next, the vessel was filled with di-methyl ether and the contents were mixed thoroughly.

Figure 8:
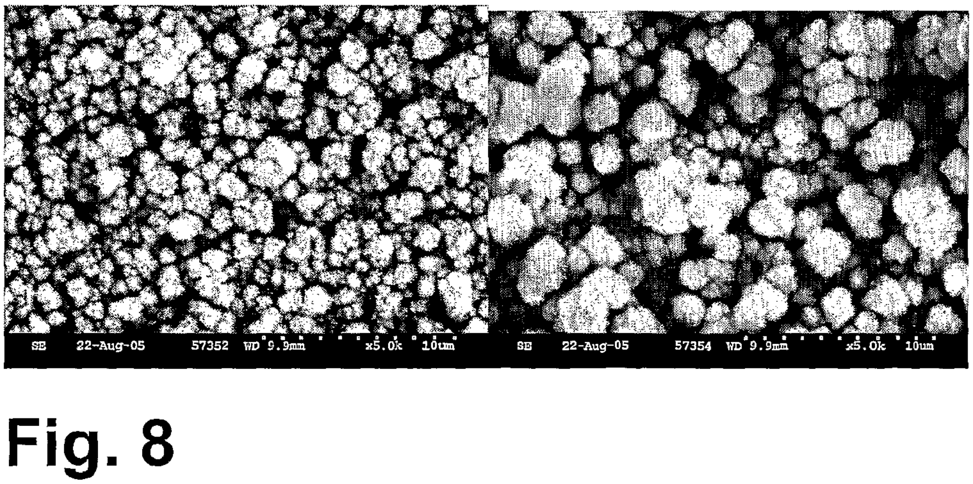
FIG. 8 illustrates SEM microstructure of a SDC made from a low concentration solution at a high deposition rate, center (left image) and edge (right image)
Figure 5:
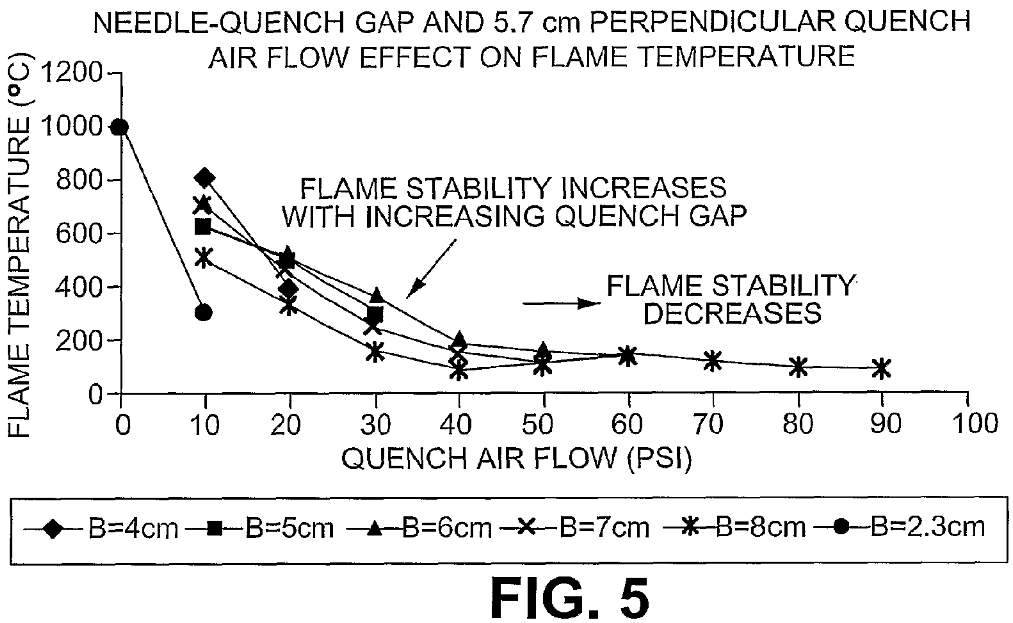
FIG. 5 is a graph showing the effect of perpendicular quench ("air knife") on flame temperature.
Figure 6:
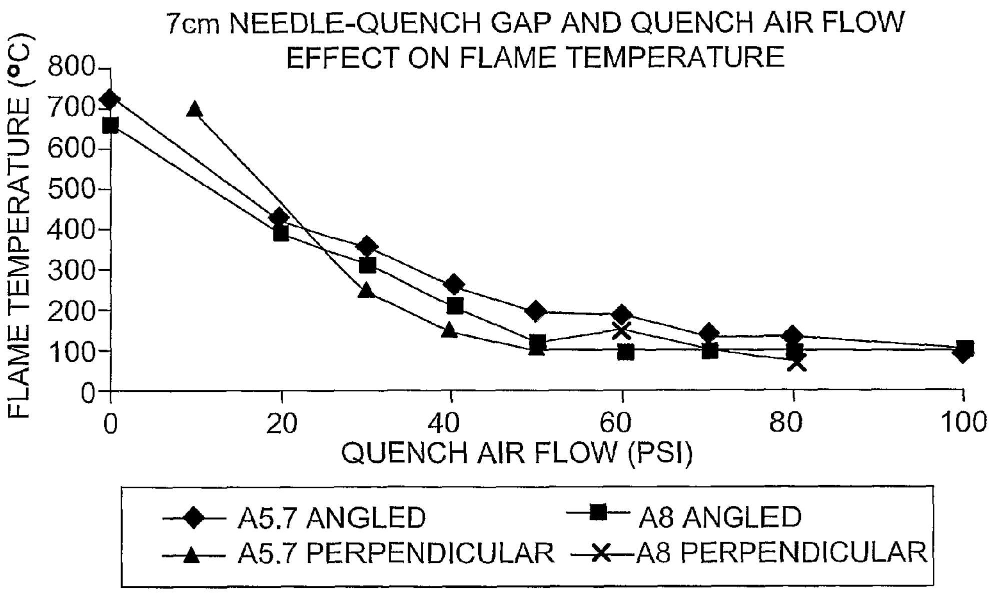
FIG. 6 illustrates the effect of quench angles on flame temperature.

The deposition temperature was in range of 960-1000 C. on the edge of the substrate. The deposition solution was 3 mM in SDC and the deposition rate was approximately 0.280 um/min. The microstructure is somewhat columnar and appears to be "cauliflower" in shape with each individual structure 1-2 um in size at the edge of the slide and mostly <1 um in the center of the sample, as seen in FIG. 8.

PEMFC MEA Fabrication

The method of the invention can be applied to produce electrocatalysts. In this context, the method can be summarized in the following four steps: (1) pumping a precursor solution into an atomizer, (2) atomizing the precursor solution, (3) combustion of the process stream to form catalyst nanocluster vapor, and (4) mixing of catalyst vapor plume with carbon powder and optionally an ionomer before depositing onto an electrolyte membrane. During the first step, chemical precursors such as metal nitrate or metal organics among others are dissolved in suitable solvents, which also act as a fuel for combustion. Water-soluble precursors may also be dissolved in water and then mixed with a suitable fuel.

Figure 10A:
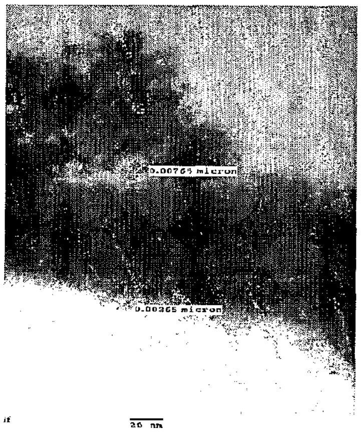
FIG. 10*a* is a TEM photograph of nanostructured platinum deposited on a Nafion substrate.
Figure 10B:
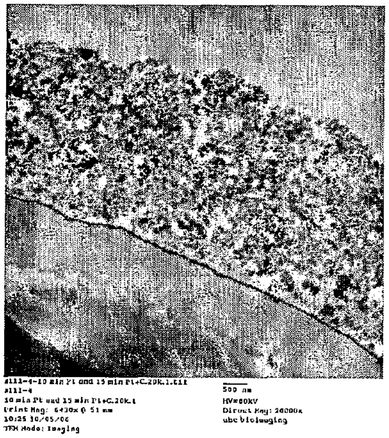
FIG. 10*b* is a TEM photograph showing gradient structure of supported Pt thin film with carbon and Nafion® particles.

The microimages for the electrocatalyst layer and the supported Pt produced in this manner are shown in FIGS. 10*a* and 10*b*.

Figure 11A:
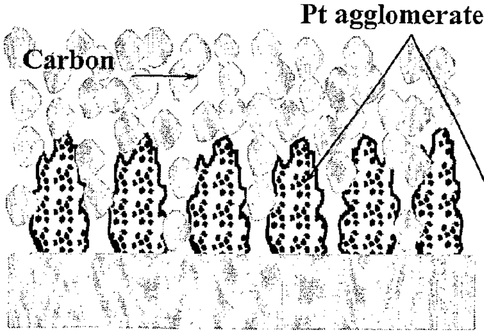
FIG. 11*a* is schematic representation of a catalyst layer structure, column shaped agglomerates of Pt nanoparticles, produced by the method of the invention.
Figure 11B:
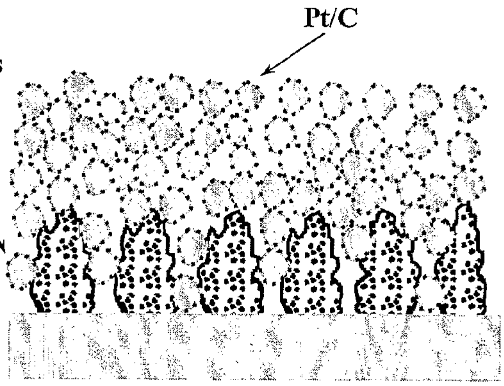
FIG. 11*b* is a schematic representation of another catalyst layer structure, column shaped agglomerates with Pt coated carbon particles.

FIGS. 11*a* and 11*b* show respectfully structurally engineered films and supported platinum nanoparticles produced according to the invention to make a highly active, high surface area material. Creating a structure with a high surface area allows for better mass transport of the oxidant to the active catalyst sites. Additionally, the amount of platinum contained in the catalyst layer can be significantly reduced, typically by almost 10 times, to significantly reduce the cost of the materials while maintaining high performance.

Figure 12:
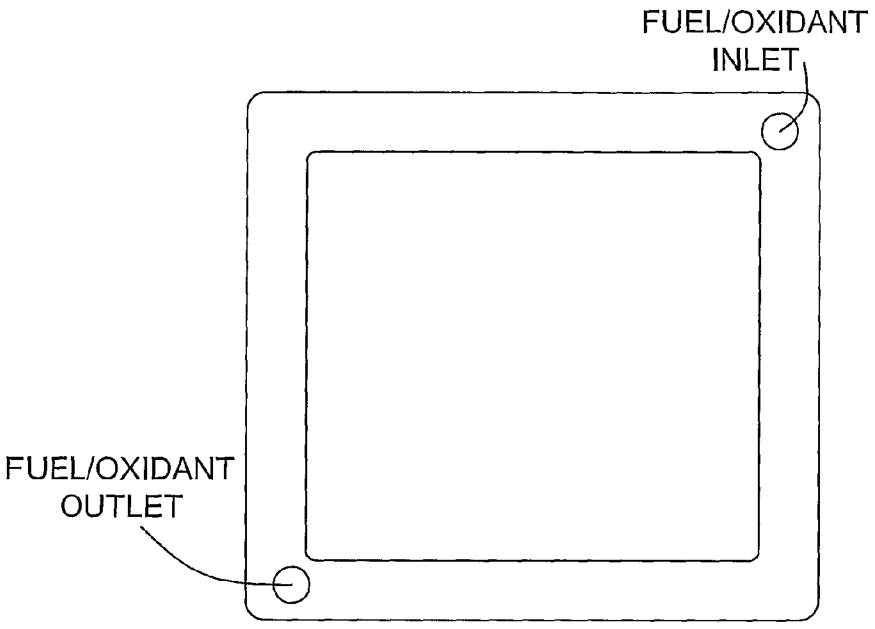
FIG. 12 illustrates two-dimensional catalyst gradient produced by the method of the invention.

The process of the invention is flexible enough to allow for the deposition of layers containing a gradient both in plane and perpendicular to the deposition surface. This gradient can be used to engineer the electrocatalyst layer to optimize the cost and performance of the membrane while addressing the problems associated with mass transport and the catalyst utilization. On the other hand, by opening up the microstructure in ECL and increasing the catalyst utilization and mass transport, higher power can be achieved even at lower loadings of catalyst. FIG. 12 schematically shows how such a tailored catalyst layer could be incorporated into a fuel cell.

Figure 9A:
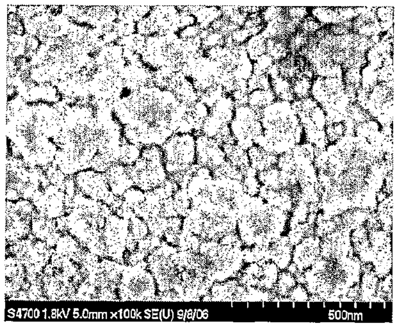
FIG. 9*a* illustrates SEM microstructure of a platinum layer produced by the method of the invention.
Figure 9B:
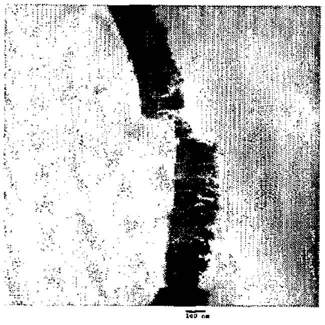
FIG. 9*b* illustrates TEM of a cross-section of the same Pt layer as in FIG. 9*a*.

A novel application of RSDT to the manufacture of a PEMFC can be accomplished by depositing an electrocatalyst layer consisting of a thin engineered structure of platinum, followed by a mixture of carbon and platinum as shown in FIGS. 9*b* & 10*a*. Due to the thin electrocatalyst layer formed by the reactive spray process, the RSDT prepared layer has much better bonding strength and controlled microstructure. As well, due to the ability to deposit a dense thin layer of platinum, the inclusion of an ionomer can be significantly reduced or eliminated altogether while still obtaining high performance.

Figure 13:
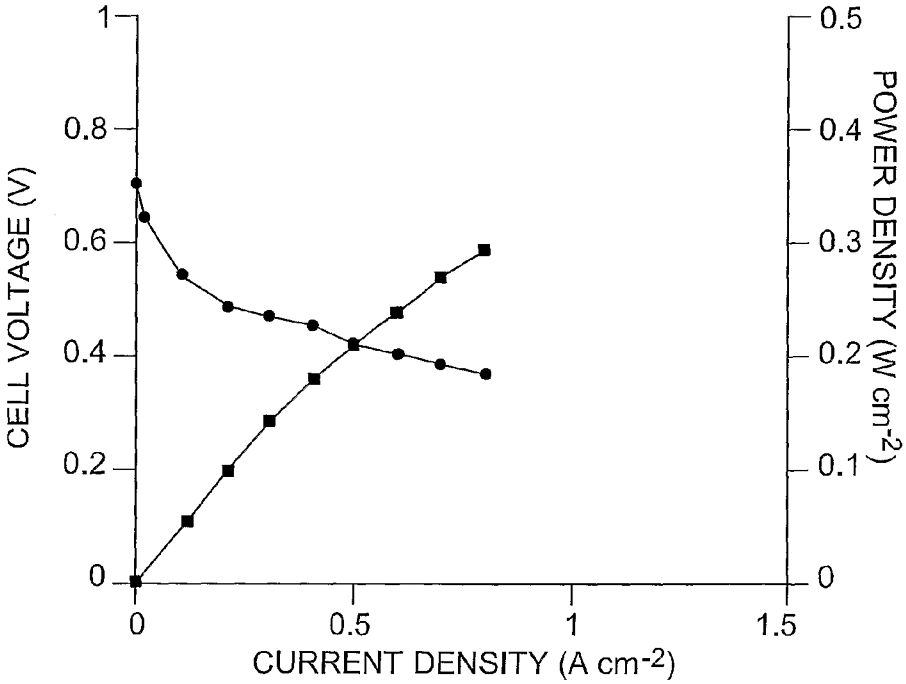
FIG. 13 is a graph illustrating the performance of a PEM cell produced by the method of the invention.

FIG. 13 shows the initial performance obtained by a cell manufactured using the RSDT process with platinum loading significantly less than that prepared by conventional techniques.

Proton Conducting Ceramics

The RSDT is also capable of depositing ceramic proton-conducting films as PEMFC electrolytes, or producing ceramic proton-conducting nanopowders as doping materials of PEMFC electrolytes. Both will enable PEMFCs to operate at 110 C. or a higher temperature, thus removing a key technical barrier to the commercialization of PEMFC technology.

In addition, RSDT can be used for preparing ceramic proton-conducting membranes for hydrogen purification and hydrogen compression devices, which have much higher mechanical strength that traditional technology and can operate at much higher temperature and pressure than those with polymer membranes.

EXAMPLES

Example 1

In Example 1, deposition of SDC was carried out on the apparatus as illustrated in FIG. 2. Two feedstock solutions were made. The first one was prepared with 0.46 g of samarium acetylacetonate (Sm-acac) and 4.67 g of cerium-2 ethylhexanoate (Ce-2eh) dissolved into 47.5 g of toluene in a container 10. Next, 215.3 grams of acetone were added to the container 10 and the container was capped off; then 112.6 g of di-methyl ether was added to the container and thoroughly shaken. The container was heated to 350 C. so that the solution formed a supercritical solution. The second solution was made exactly the same as the first but without Sm-acac and Ce-2eh and was designated as blank. The blank was stored in a separate container 10. The pump was set to a flow rate of 4 ml/min and the blank solution was passed into the nozzle. The frequency of the induction heater 32 was set to 271 kHz and the nozzle temperature 35 was set to 350 C. The oxidant 50 and fuel gas 46 for the burner assembly were oxygen and methane respectively. The shaping gas 40 was set to a flow rate of 3 L/min and heated to a temperature of 350 C. The methane and oxygen in the burner assembly were ignited by a spark. A 17 mm round substrate 56 of NiO—YSZ (8% Y stabilized) was placed onto a holder 58 and held on a vacuum chuck. Additionally, the holder 58 was heated by resistive heaters. The substrate 56 was heated to 400 C. via the holder 58. A spark ignited the spray 36 while the blank solution was flowing in the tube 24 and the burner assembly 54 maintained the flame. The flame 54 was brought close to the substrate 56 in a controlled manner by the use of linear motion system. Upon reaching a substrate 56 temperature of 960-1000 C., the blank solution was switched to the regular feedstock solution 12. Deposition of SDC lasted for 70 minutes. Upon completion of the deposition the feedstock solution 12 was switched back to blank and the flame 54 was moved away incrementally to minimize thermal shock to the substrate 56. The sample was then analyzed by SEM as seen in FIG. 8.

Example 2

Figure 4:
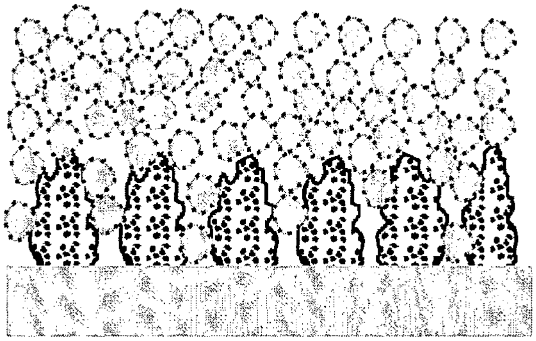
FIG. 4 is a schematic representation of an exemplary structure (Example 2) produced by the method of the invention.

In Example 2, a bilayer of Pt and Pt/carbon for use in PEM fuel cells was deposited by RSDT. First, 0.75 g of Pt-acetylacetonate was dissolved in 197.6 g of toluene in a container 10. Next, 39.5 g of propane was added and the container was thoroughly mixed. The solution 12 was heated to 350 C. The substrate 56 (FIG. 4) in this example was a Nafion® membrane. In this example, a set of air knives 72 was used to cool the flame 54 so that the substrate 56 was maintained below 140 C. The reaction plume consisted initially only of streams 54 and 72 for the initial deposition of the Pt sublayer 90 onto the Nafion® membrane 56. The flow rate of the Pt feedstock was set to 4 ml/min. The frequency of the induction heater was set to 271 kHz and the nozzle temperature 35 was set to 200 C. The oxidant 46 and fuel gas 50 for the burner assembly were oxygen and methane respectively. The shaping gas 40 was set to a flow rate of 1.95 L/min and heated to a temperature of 350 C. The methane 50 and oxygen 46 in the burner assembly were ignited by a spark. A substrate 56 of Nafion® was placed onto a holder 58. A spark ignited the spray 36 while the feedstock 12 was flowing in the tube 24 and the burner assembly 55 maintained the flame. The flame 54 was maintained at a distance of 13 cm from the substrate 56 to avoid any substrate damage. The temperature of the substrate 56 was maintained below 140 C. A motion program was set up so that the reaction plume would cover the 7×7 cm substrate. The Pt sublayer 45 (FIG. 4) was deposited for 10 minutes, and the substrate was removed from the reaction plume 54 and 72.

Next, a set of air shear nozzles 80 was used to atomize a slurry 78 of 0.28 g Vulcan XC-72R carbon dispersed in 68 g of propanol. The slurry 78 was atomized into a spray 82. The atomization of slurry 78 was controlled by the supply of pressurized air 74 to nozzles 80. The air supply pressure was 25 psi. The flow rate was determined by the pressure on slurry 78, the pressure controlled by a pressure regulator 79 installed on the compressed air line 81. Once the nozzles were operational, the substrate was moved back into the reaction plume that now contained stream components 54, 72 and 82. The pressure on slurry 78 was set to 5 psi. This resulted in the deposition of a layer consisting of Pt particles 93 deposited onto carbon 95. Total time of the deposition was 15 minutes.

INDUSTRIAL APPLICABILITY

While the invention has been identified in the specification as applicable in the field of fuel cells and specifically to produce fuel cell membranes, it will be appreciated that the invention may be applicable to other fields where known thermal spraying methods are typically used.

The invention claimed is:

1. A method for spraying a reactive fluid feedstock, the method comprising providing a conduit having a first end and a second end respectively including an opening port and an exit port, the size of the exit port being smaller than the size of the opening port, the second end forming or associated with a tapered nozzle, heating a reactive feedstock to a supercritical temperature in a volume distinct from the volume of the conduit and then passing the reactive feedstock under pressure through the conduit from the opening port to the exit port and through the tapered nozzle to create a feedstock spray, providing a chamber enclosing the conduit, the chamber being in communication with a source of an auxiliary gas and with the exit port, passing an auxiliary gas through the chamber into the feedstock spray, said auxiliary gas and said feedstock spray turbulently mixing within the chamber; and igniting the turbulently mixed feedstock and the auxiliary gas spray resulting in a reactive fluid flame spray at the exit port.

2. The method according to claim 1 which further comprises introducing a spray of a supplementary material into the path of the reactive fluid frame spray in order to produce a combined coating resulting from the reactive feedstock and the supplementary material.

3. The method according to claim 1, including controllably reducing the temperature of the reactive fluid flame spray to produce a desired degree of reaction and to control the properties of particulate products of the reactive fluid frame spray.

4. The method of claim 3 wherein the step of controllably reducing the temperature comprises blowing a curtain of non-flammable gas into a path of the feedstock spray.

5. The method according to claim 4 wherein a spray of supplementary material is delivered into the reactive fluid frame spray downstream of entry of the non-flammable gas into the reactive fluid frame spray.

* * * * *